(12) United States Patent
Hummler

(10) Patent No.: US 6,617,213 B2
(45) Date of Patent: Sep. 9, 2003

(54) METHOD FOR ACHIEVING HIGH SELF-ALIGNING VERTICAL GATE STUDS RELATIVE TO THE SUPPORT ISOLATION LEVEL

(75) Inventor: Klaus Hummler, Poughkeepsie, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/057,065

(22) Filed: Jan. 25, 2002

(65) Prior Publication Data

US 2003/0143809 A1 Jul. 31, 2003

(51) Int. Cl.[7] .............................................. H01L 21/336
(52) U.S. Cl. ........................................ 438/270; 438/268
(58) Field of Search ................................ 438/197, 257, 438/258, 259, 268, 270, 271, 272

*Primary Examiner*—Kamand Cuneo
*Assistant Examiner*—Scott B. Geyer
(74) *Attorney, Agent, or Firm*—Slater & Matsil, L.L.P.

(57) ABSTRACT

A vertical gate transistor has a gate stud (14) that extends above the substrate (20) surface in order to contact a word line. The stud is formed of a first material (26) and a second material (28) having differently selective etch characteristics. The second material (18) is formed within a recess in the first material (26), and the first material (26) is then selectively etched back substantially, with the second material remaining and extending above the surrounding substrate. The gate stud (14) can then accommodate a thick array top oxide (34) and subsequent chemical mechanical polish and perform in a wide process window.

12 Claims, 6 Drawing Sheets

METHOD FOR ACHIEVING HIGH SELF-ALIGNING VERTICAL GATE STUDS RELATIVE TO THE SUPPORT ISOLATION LEVEL

TECHNICAL FIELD OF THE INVENTION

This invention relates generally to memory fabrication, and more specifically to a method for achieving high self-aligning vertical gate studs relative to the support isolation level.

BACKGROUND OF THE INVENTION

A driving motivator in commercial memory cells design and architecture is the desire to pack more memory capability into a smaller integrated circuit. This goal necessarily involves competing trade-offs in cost, circuit complexity, power dissipation, yield, performance, and the like. Trench capacitors are known in the art as an architecture whereby the overall size (in terms of surface area or chip "real estate") of the memory cell is reduced. The size reduction is accomplished by taking a planar capacitor element of the memory cell and forming the capacitor instead in a trench, also known as a deep trench. As is known in the art, a typical DRAM cell includes a capacitor upon which is stored a charge (or no charge depending upon the cell's state) and a pass transistor, which is used to charge the capacitor during writing and in the read process to pass the charge on the capacitor to a sense amplifier. Yet further improvement in device geometry and performance is accomplished by forming the pass transistor vertically as well, preferably in the upper region of the deep trench in which the trench capacitor is formed.

In current DRAM microchip fabrication, another trench, an isolation trench, isolates the different cells of the memory chip from one another. The isolation trench attenuates various problems associated with densely packed memory cells, such as out diffusion of buried layers, leakage current, and the like.

In one stage of the manufacturing process of the memory chip, such as the DRAM chip, the isolation trench is typically filled with isolation trench oxide (ITO) to help the isolation trench perform its isolation function. However, at some point in the chip fabrication, the isolation trench with its ITO must be planarized, so that the proper electrical connections can be made over the isolation trench without an electrical short being produced.

In the prior art, the height of the planarization of the isolation trench is determined by the height of a pad nitride layer, a temporary isolation layer covering the silicon region surrounding the deep trench. Whatever the height of the pad nitride layer, this will also be the height at which the isolation trench is planarized. There is a maximum allowable height for the isolation trench after planarization; otherwise the step height between the isolation trench and the adjacent silicon region would be too high. This excessive step height causes subsequent difficulties in the manufacturing process. For instance, in a subsequent processing step, word lines are formed to interconnect the various memory cells in the array and these word lines must cross over the step. The word line material, typically tungsten or tungsten silicide, may not be completely etched away in the region of the step height when patterning the word lines, resulting in short circuits between adjacent word lines. Therefore, the top of the pad nitride should be set to a low level to enable a sufficient degree of planarization of the isolation trench without causing excessive step height.

However, there is also a minimum height for vertical gate studs that are required to contact the word lines. These vertical gate studs need to be high enough to protrude above an array top oxide (ATO) that is formed over the array region. The ATO ensures that passing word lines are sufficiently isolated from the active regions. The vertical gate studs, however, need to contact the active word lines. Therefore, the vertical gate stud should be designed to be sufficiently high to allow a sufficient amount of array top oxide to insulate a passing word line from any unwanted interactions with any active regions.

However, in the prior art, the planarization of the isolation trench to the height of the pad nitride layer also disadvantageously determines the height of vertical gate studs. The isolation trench and the vertical gate studs are both chemically-mechanically polished (CMP) simultaneously to the level of the pad nitride surrounding the vertical gate stud, with the layer of array top oxide added afterwards. The polishing step has no way of discerning the isolation trench and the vertical gate stud.

This above correspondence between the height of the pad nitride and both the IT and the vertical gate studs creates a dilemma. The above constraints, a lower pad nitride height for the planarization of the isolation trench, but a higher pad nitride height to create higher vertical gate studs, create conflicting demands. It would be advantageous to have a method of manufacture of a higher vertical gate stud height that is not dictated by either the height of the pad nitride or the need to planarize the support isolation trench. Therefore what is needed in the art is a method of creating higher vertical gate studs that overcome the deficiencies of the prior art.

SUMMARY OF THE INVENTION

In one aspect, the present invention provides for a method of fabricating a vertical gate transistor. The method includes forming a trench in a semiconductor substrate, the area of the trench being defined in at least one direction by a pad layer formed atop the semiconductor substrate and forming a gate conductor in the trench. The method further includes forming a recess within the trench and partially filling the recess with a conformal conductive layer while leaving a first recess within the conformal conductive layer and at least partially filling the first recess with a second conductive layer. The conformal layer is etched to a level substantially coplanar with the pad layer, after which the pad layer is removed. The method further includes etching back the conformal conductive layer to a level below a top surface of the semiconductor substrate, forming a liner layer atop the semiconductor substrate, the gate conductor, and the second conductive layer.

In another aspect, the invention provides for a vertical gate transistor comprising a trench formed within a semiconductor substrate, a gate oxide formed on the sidewall of the trench, and a gate conductor formed within the trench. The transistor further includes a vertical gate stud protruding above the surface of the semiconductor substrate. The vertical gate stud includes a conductive first region contacting the gate conductor formed within the trench and extending a first distance above the semiconductor substrate, a conductive second region contacting the first region and extending above the first region, the conductive second region and first conductive region having differing etch resistance characteristics, and a gate contact formed above and contacting said second conductive region.

In yet another aspect, the present invention provides for a memory cell comprising a trench formed within a top surface of a semiconductor substrate, a capacitor formed within a lower portion of the trench, comprising a buried layer adjacent the trench, an insulator layer formed on a sidewall of the trench, and a conductor formed within the lower portion of the trench, and a conductive buried strap region electrically coupled to the capacitor. The memory cell further includes a gate oxide formed on a sidewall of an upper portion of the trench and a gate conductor formed within the upper portion of the trench. The memory cell further includes a gate stud extending above the top surface of the semiconductor substrate. The gate stud includes a first material formed on the gate conductor, the first material being subject to etching by a pre-selected etchant and second material formed on the first material and being resistant to etching by the pre-selected etchant. The first material and the second material provide a conductive element that extends the gate conductor to a level of a wiring layer above the memory cell.

BRIEF DESCRIPTIONS OF THE DRAWINGS

The above features of the present invention will be more clearly understood from consideration of the following descriptions in connection with accompanying drawings in which:

FIG. 1b illustrates a cross section, taken through the active region, of the memory cell array illustrated in FIG. 1a;

DETAILED DESCRIPTION OF PREFERRED EMBODIMENTS

Figure 1A:
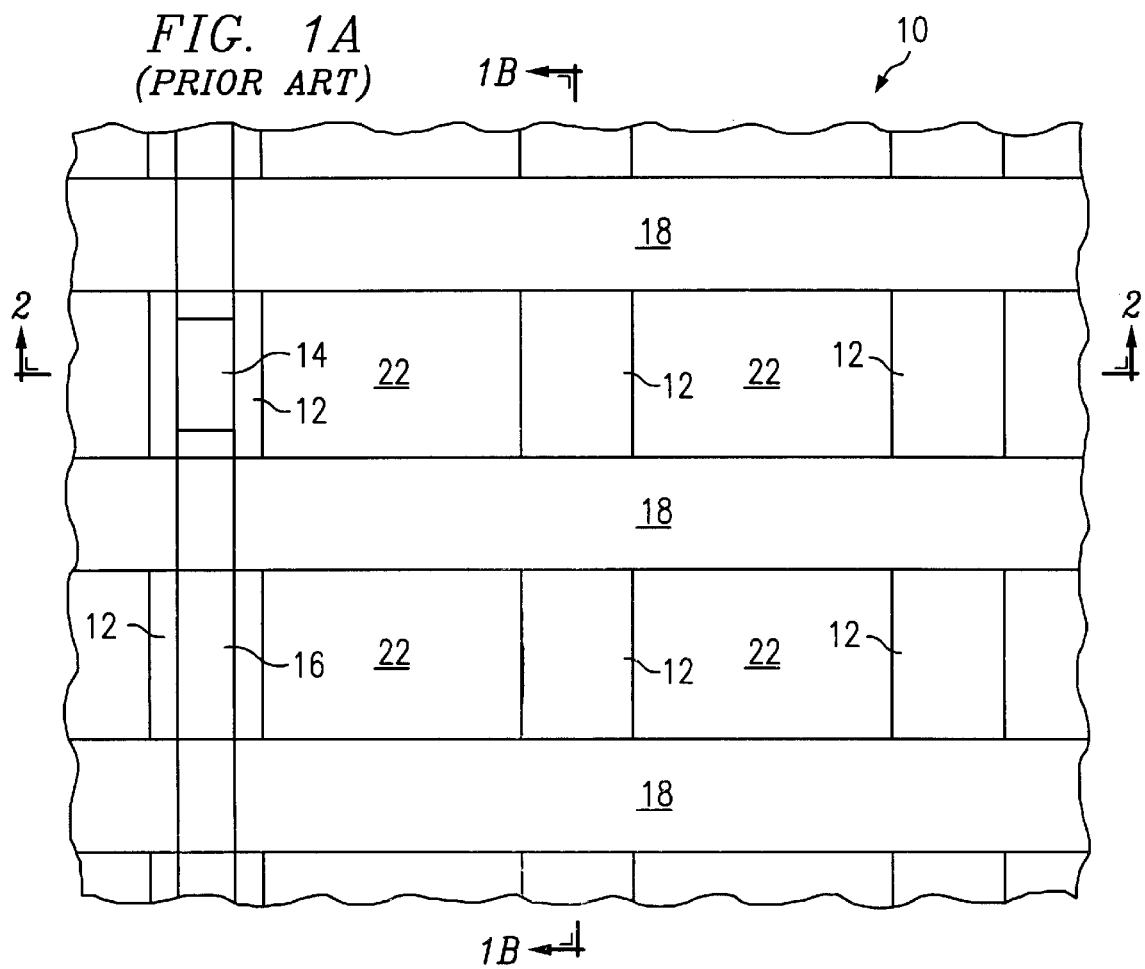
FIG. 1a illustrates in plan view a portion of a memory cell array wherein preferred embodiments of the present invention can be advantageously employed.

FIG. 1a illustrates in plan view a portion of a memory cell array 10. Each memory cell includes a deep trench 12, several of which are shown. Formed within the deep trench 12 is a gate conductor (typically polysilicon or the like) above which is formed a vertical gate stud 14. Only one stud 14 is shown for clarity, although a vertical gate stud is formed in each deep trench, as will be described in greater detail below. One skilled in the art will recognize that several features of a memory cell, not necessary for an understanding of the invention, have been omitted from the figure. Note that the memory cells are separated be a greater distance in the horizontal direction than in the vertical direction. Whereas the horizontal separation, typically three times the minimum feature size or "3F" is sufficient to prevent undesirable current flow between cells, the vertical separation, typically only 1F, is not sufficient. For this reason, isolation trenches (IT) are formed as horizontally running trenches separating adjacent rows of the memory cell array. As discussed above, the isolation trenches are typically filled with an IT oxide 18. Also shown in FIG. 1a is word line 16 that overlies the trenches and gate studs and electrically contacts the gate studs as is well known to those skilled in the art.

Figure 1B:
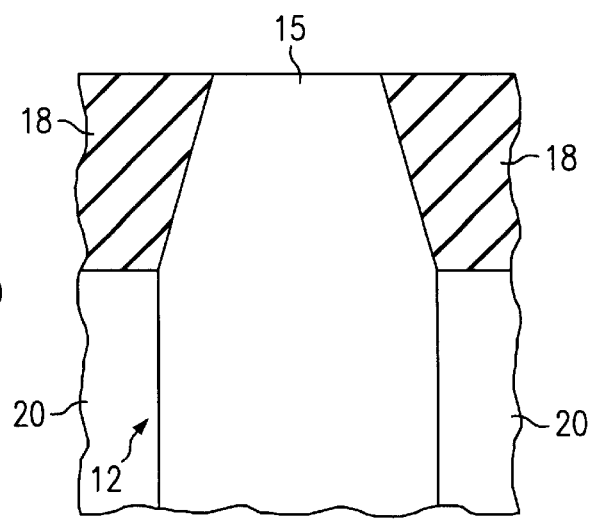

FIG. 1b illustrates a cross sectional view of an exemplary memory cell of FIG. 1a, illustrating how the vertical ends of the deep trench 12 formed in substrate 20 are truncated by isolation trenches, which are filled with IT oxide 18. In the step illustrated in FIG. 1b, the isolation trenches have been formed and have been filled with IT oxide 18, which has been planarized using a CMP process. The intermediate structure illustrated in FIG. 1b can be obtained using well-known standard semiconductor memory process steps. Further details regarding the formation of the intermediate structure (and subsequent processing steps) is provided in commonly owned, co-pending patent application Ser. No. 09/888,202, filed on Jun. 22, 2001, and entitled "Memory Cell Layout with Double Gate Vertical Array Transistors," which application is incorporated herein by reference. Note that the deep trench has also been previously formed and has been filled with a gate material, such as polysilicon 15. The polysilicon gate material 15 is also planarized during the CMP process that planarizes IT oxide 18. Although it is desirable to form the IT trenches, as discussed above, it is undesirable to decrease the height of the vertical gate stud in the process.

Figure 2:
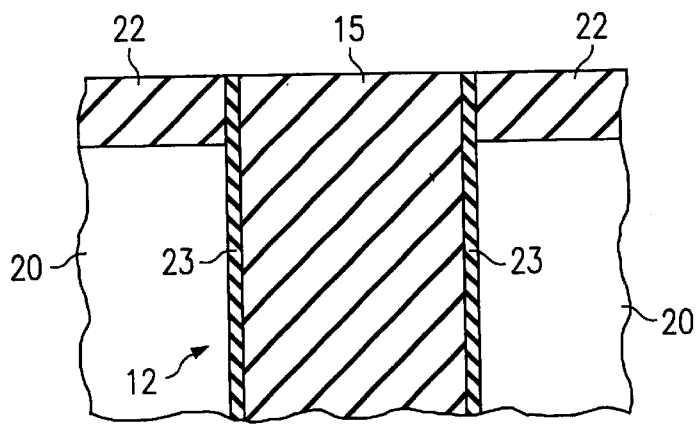
FIGS. 2 through 11 illustrate intermediate steps in the formation of a preferred embodiment vertical gate transistor.

Turning now to FIG. 2, a portion of an exemplary memory cell is illustrated in cross section along the line 2—2 shown in FIG. 1a. Note that because the cross section of FIG. 2 is along the horizontal axis, isolation trench 18 is not illustrated in the figure. The structure illustrated in FIG. 2 is shown in the same intermediate process step as that shown for FIG. 1b, however. What can be seen in FIG. 2 is pad nitride layer 22 that defines the vertical gate stud in the horizontal direction. Also shown is the thin gate oxide layer 23 that has been formed on the sidewalls of deep trench 12, as is known in the art. As discussed above, the intermediate structure shown in FIG. 2 is the result of the CMP step in which IT oxide 18 (FIG. 1b) has been planarized, resulting also in the planarization of vertical gate polysilicon layer 15 and nitride layer 22. As discussed above, it is desirable to maximize the height of vertical gate stud relative to the surrounding regions and the subsequently deposited ATO. The following discussion provides a preferred embodiment process for accomplishing this objective. Typically in the prior art, the pad nitride layer 22 would be removed at this point in the manufacturing process. As will be discussed below, the pad nitride layer is advantageously left in place for subsequent processing steps to provide a self-aligning process.

Figure 3:
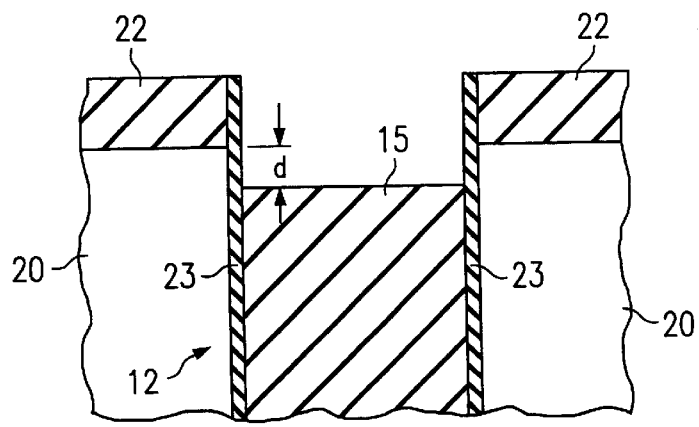

As demonstrated in FIG. 3, in one preferred embodiment of the present invention, polysilicon 15 is stripped and recessed by using an etch selective to pad nitride 22, such as Chemical Dry Etching (CDE) or other well known selective etch process. Polysilicon layer 15 is etched to below the level of the surface of the surrounding silicon, preferably in the range of 300 to 1000 Angstroms deep. At the upper end, the recess should not extend below the level of the drain diffusion (not shown) for the pass transistor, typically in the range of 100 nm.

Not stripping the pad nitride 22 at this point,- is advantageous in that the disclosed process is self-aligning. In other words, when the pad nitride 22 is stripped, then the definition of placement of the deep trench is lost. Although, in the prior art, the vertical stud did protrude over the vertical trench, the height of the vertical stud was typically only as much as the height of the pad nitride after the isolation trench CMP.

Figure 4:
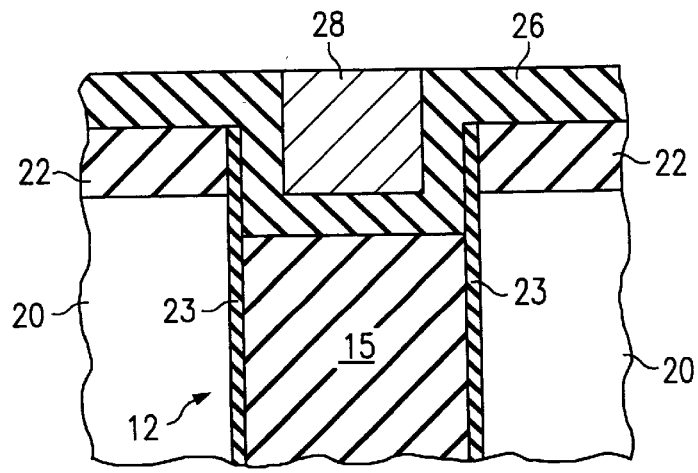

Next, in FIG. 4, a conformal layer 26 is deposited on top of both pad nitride 22 and recessed polysilicon 15. The conformal layer 26 is preferably doped polysilicon, although other substitutes will be apparent to one of ordinary skill in the art. The conformal layer 26 should be of substantially uniform thickness over all surfaces, both horizontal and vertical, of both the pad nitride 22 and the recessed polysilicon 15.

In one preferred embodiment, the conformal layer 26 is 300 to 400 Angstroms thick. In the preferred embodiments, it is desirable that the recess in polysilicon layer 15 not be entirely filled in with conformal layer 26, in order to leave a recess that is subsequently filled with another conductive material, such as silicon germanium layer 28. With that limitation in mind, a desirable thickness or range of thicknesses is a matter of design choice. After the deposition of the conformal polysilicon layer 26, there should still be a cavity in the middle of the conformal layer 26, as the conformal layer 26 only partially fills the recess created by the recessed polysilicon 15. This cavity is then in turn filled in with, e.g. silicon germanium 28, as shown in FIG. 4. The selection of conformal layer 26 as polysilicon and second conductive layer 28 as silicon germanium is a matter of design choice. The important characteristics of the two layers, as will become apparent below, is that conformal layer 26 have properties such that it can be selectively etched relative to layer 28. Several combinations of well known conductive semiconductor materials having selective etch properties could be used for layers 26 and 28.

Figure 5:
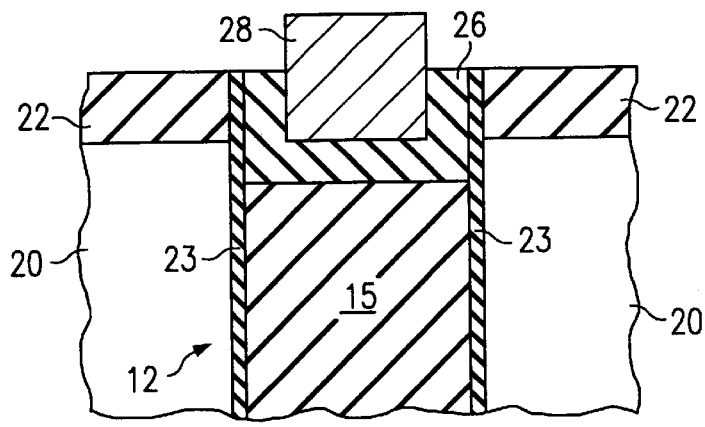

Conformal layer 26 is then selectively etched back to the level of pad nitride 22 using, e.g. a CDE process, although one skilled in the art will recognize that other selective etch processes can be chosen as a matter of routine design choice, resulting in the structure illustrated in FIG. 5. Because the etchant is selective to silicon germanium, layer 28 is not etched back during the step, and hence layer 28 protrudes above layer 26 after the selective etch. The silicon germanium layer 28 should therefore advantageously protrude higher than the pad nitride 22.

Figure 6:
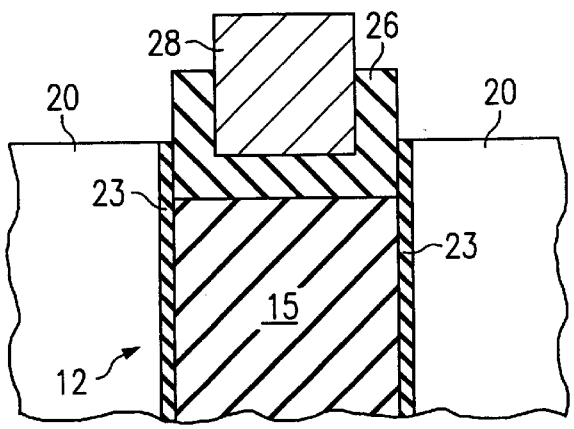

As shown in FIG. 6, pad nitride 22 is then stripped away with a nitride etch, such as hot phosphoric acid, to expose the underlying silicon region. Note that before the stripping of the pad nitride 22, there is typically an oxide deglaze to remove any residual oxide layer that forms on the surface of pad nitride 22 during previous process steps. The resulting structure, as shown in FIG. 6, has a protruding feature formed from the remaining conformal layer 26 and the silicon germanium layer 28.

Figure 7:
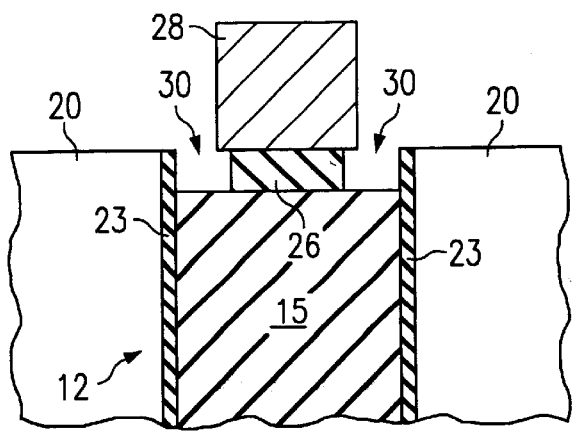

FIG. 7 illustrates the formation of a divot 30 around the periphery of the gate conductor by the selective etching away of conformal layer 26. Typically ammonium hydroxide or a similar etch is used to create the divot 30 in the preferred embodiments in which the conformal layer is composed of polysilicon, while the second conductive layer is composed of silicon germanium. Note that the etch undercuts a portion of conformal layer 26 beneath the second conductive layer 28. The etch may also etch back a portion of polysilicon gate conductor 15.

The divot 30 generally forms a cavity for the introduction of insulating material, such as nitride liners, such as detailed in FIG. 8, below. Further details regarding the advantageous features of forming divot 30 and processes therefore are provided in commonly assigned co-pending patent application Ser. No. 09/966,644 filed Sep. 28, 2001, and entitled "An Integrated Spacer for Gate/Source/Drain Isolation in a Vertical Array Structure," which application is incorporated herein by reference. One advantageous feature of a device formed with insulator filled divot 30 is that the device is more tolerant of misalignment in the subsequently formed gate contacts.

Figure 8:
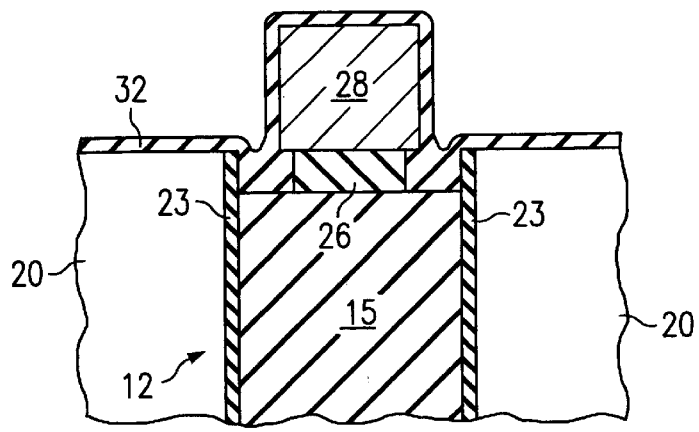

Nitride liner 32 is next formed, as illustrated in FIG. 8. Typically, this is done in a two step process. In the first step, a conformal nitride layer is applied and fills in divot 30 as well as forming atop the planar surfaces. This nitride layer is then etched back from the planar surface. In the second step, another nitride layer is conformally formed over the planar surfaces, resulting in nitride liner 32. The nitride liner 32 completely encapsulates the gate stud, hence insulating the stud even in the case of misalignment of subsequently formed bit line contacts.

Figure 9:
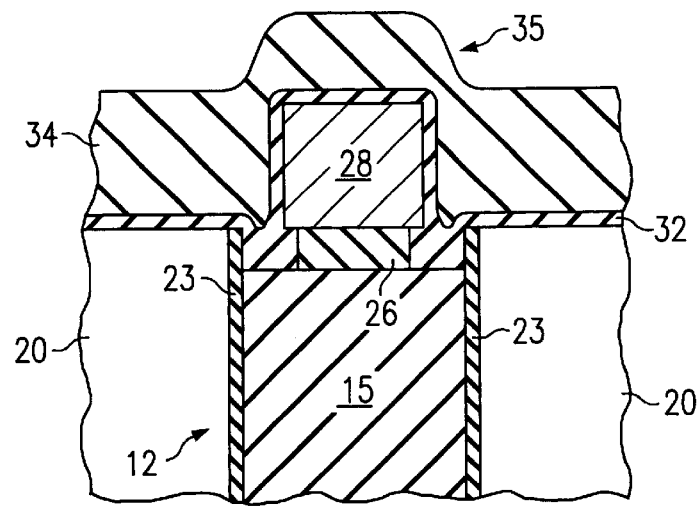
Figure 10:
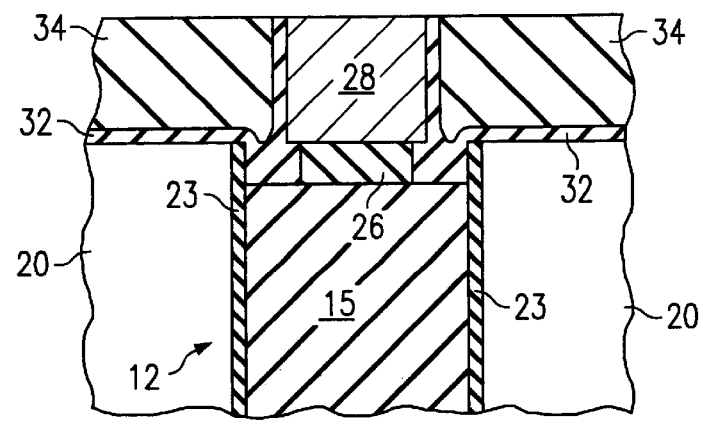

In FIG. 9, array top oxide (ATO) 34, an insulator, is then deposited on silicon nitride liner 32. Typically, ATO is conformally deposited, resulting in a large hump region 35 formed above the protruding gate stud. Preferably, ATO is deposited to a thickness in the range of around 600 to 800 angstroms. The ATO is then subjected to a CMP planarization, as illustrated in FIG. 10. After CMP, the thickness of the ATO after CMP may typically be approximately 300 Angstroms. This CMP step also removes the portion of nitride liner 32 overlying the top of the gate stud (formed of second conductive layer 28). This opens a contact window to the gate stud. Note that the other portions of the gate stud are still insulated by nitride liner 32, including the portion of nitride liner 32 filling divot 30.

Figure 11:
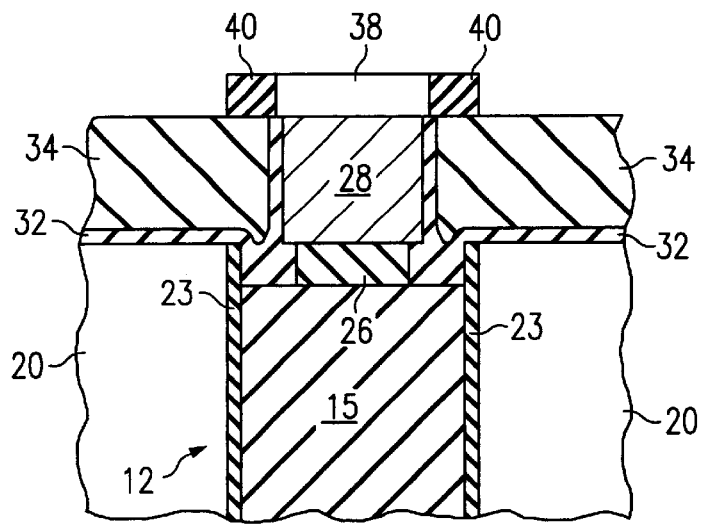

In FIG. 11, a patterned gate contact 38 is formed atop and contacts the gate stud. A nitride liner 40 is then formed on the sidewalls of the patterned gate contact 38, as is known in the art.

Figure 12:
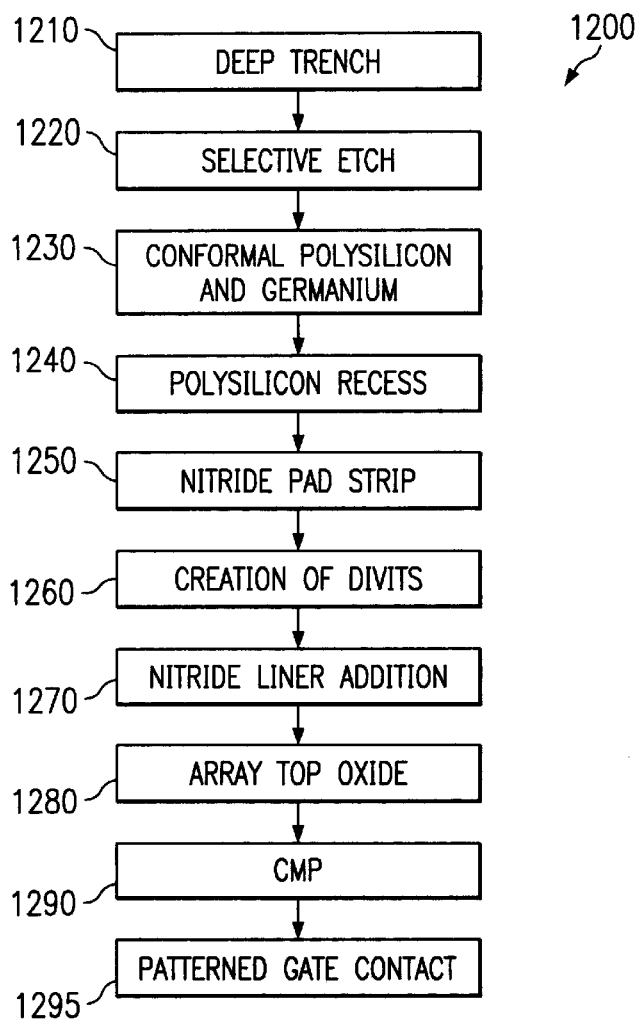
FIG. 12 illustrates a method for achieving self-aligning higher vertical gate studs relative to the support isolation level constructed according to principles of the present invention.

FIG. 12 discloses a method for achieving self-aligning higher vertical gate studs relative to the support isolation level 1200 constructed according to principles of the present invention.

In a deep trench 1210 step, a deep trench is formed within a silicon wafer. Pad nitride is layered around the deep trench and the deep trench is filled up to the top of the pad nitride with doped polysilicon. Various methods for the formation of deep trenches are well known in the art, and will therefore not be described in greater detail.

Next, in a selective etch 1220 step, the doped polysilicon is then recessed and etched, using an etch step that will not etch the pad nitride or the silicon support isolation level. The doped polysilicon may typically be etched down to between 300 Angstroms to 1000 Angstroms below the support silicon.

Next, in a conformal polysilicon and germanium 1230 step, conformal polysilicon is layered in the cavity created in the doped polysilicon by the selective etch of step 1220. Silicon germanium is then deposited into the remaining cavity within the conformal polysilicon. One skilled in the art will recognize the need to perform an etch back or a CMP step subsequent to formation of the conformal layers, as described above with reference to FIGS. 1 through 5.

A conformal polysilicon recess 1240 step is performed after the step 1230 has been executed. In the conformal polysilicon recess 1240 step, an etch selective to both pad nitride and silicon germanium is used. In one preferred embodiment, the conformal polysilicon is etched away to being substantially even with the top of the pad nitride. This etching allows the silicon germanium to protrude upwards from the remaining conformal polysilicon.

Next, a nitride pad strip 1250 step is executed. First, as detailed in FIG. 6, above, there is a deglaze to remove any native oxides on the nitride layer. After the deglaze, the pad nitride is etched away, using an etch that is selective to silicon germanium, polysilicon, and the underlying support silicon. After the nitride pad strip 1250 step is performed, at least a portion of the silicon germanium protrudes above the silicon support, which was previously covered by the nitride pad.

Next, a creation of divots 1260 step is performed. The conformal polysilicon is etched away to create a divot around the silicon germanium. The divots will preferably be horizontally measured from the top of the silicon support to the top of the recessed polysilicon. The use and theory of divots have been described with reference to FIG. 7, above, and will therefore not be described in further detail.

Next, in a nitride layer addition 1270 step, a liner of silicon nitride is layered over the exposed areas of the silicon support and across all exposed areas of the silicon germanium, creating a stub of silicon germanium atop the divot layer. A separate SiN divot fill is preferable, as described above, because the SiN liner described here typically is too thin to fill in the divot completely. The silicon nitride liner acts as an insulator.

Next, in an array top oxide 1280 step, an insulating layer of ATO is layered around the silicon nitride liner encased silicon germanium. In one preferred embodiment, the top surface of the ATO around the silicon germanium (encased in the silicon nitride liner) is substantially level with the top of the silicon nitride liner on the top of the silicon germanium. In another preferred embodiment, the ATO may also be layered on top of all of the silicon nitride liner to create a substantially planar surface, i.e. the ATO will cover all surfaces of the wafer.

Next, in a CMP 1290 step, a CMP is performed on the ATO. In one embodiment, the ATO is CMPed to be substantially level with the top of the silicon germanium, i.e. the silicon nitride liner on the top of the silicon germanium has been CMPed and is no longer present. The silicon germanium can now conduct electrical signals from another source, down through the divot layer (which is recessed conformal polysilicon), down through the recessed polysilicon, and then into the deep trench area.

Finally, in a patterned gate contact 1295 step, a patterned gate contact made of a conducting material is placed upon the silicon germanium. In one preferred embodiment, the patterned gate contact will also have surrounding it a silicon nitride liner as an insulator.

The patterned gate contact conducts electrical signals through the silicon germanium and through the divot layer (which is doped and recessed conformal polysilicon) through the recessed polysilicon itself down to the various active areas of the deep trench. The patterned gate contact is situated on top of the silicon germanium, and the silicon germanium is placed at a higher vertical level creating a stub that is placed relatively higher than that which is found in the prior art.

Figure 13:
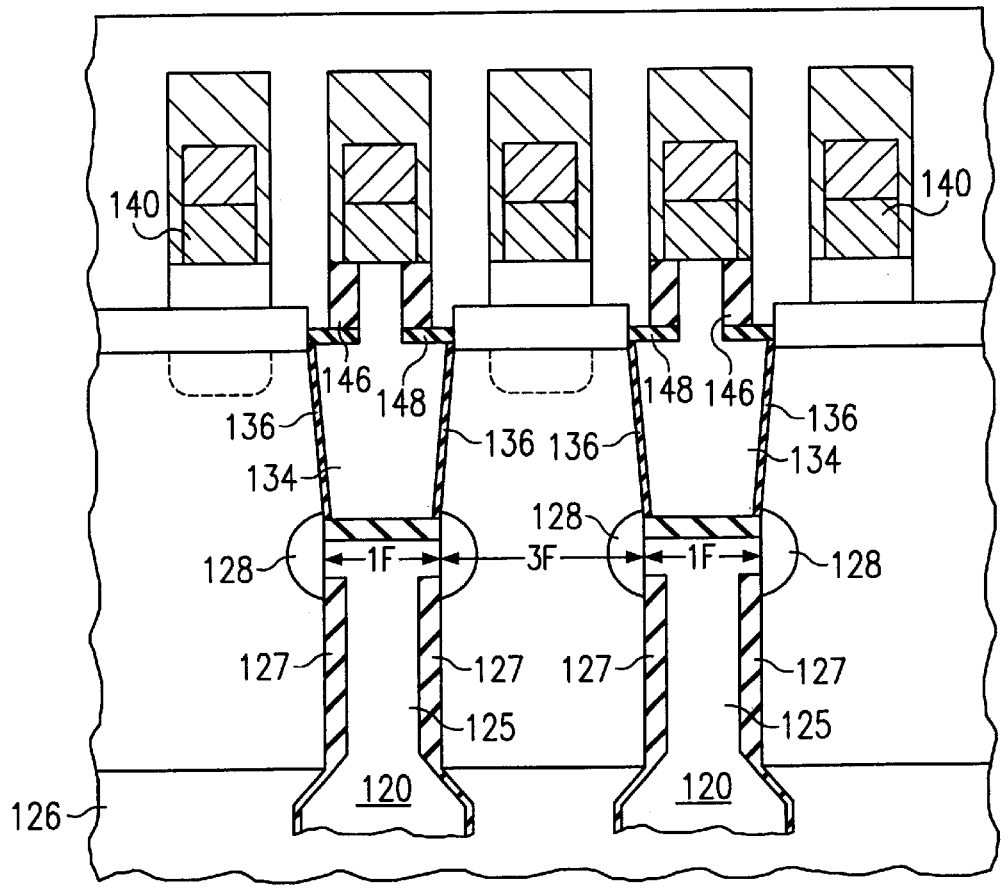
FIG. 13 illustrates a cross section of a preferred embodiment vertical gate transistor in a memory cell.

FIG. 13 illustrates an exemplary memory cell formed using the structures and methods of a preferred embodiment of the present invention. A storage capacitor is formed within a deep trench 120. A buried plate or buried region 126 forms one plate of the capacitor. In the preferred embodiments, buried plate 126 is a heavily doped region, preferably n-doped, formed within a bulk p-type semiconductor substrate. Alternatively, of course, buried plate 126 could be a p-type region formed within an n-type bulk substrate or within an n-type well formed within a p-type substrate. A thin dielectric layer 127 such as of oxide or nitride or any combination of both or any other high-k material in region 128 formed around the periphery of deep trench 120 forms the capacitor dielectric and doped, preferred n-type polysilicon 125 formed within the lower region of deep trench 120 forms the other plate of the storage capacitor. In the preferred embodiments, the resulting gate stud extends at least 90 nm above the semiconductor surface, although studs of greater or lesser height are clearly within the contemplated scope of the present invention.

FIG. 13 also illustrates the upper region of deep trench 120. The upper region of deep trench 120 includes a doped gate polysilicon 134, (preferably n-type, in other embodiments, p-type doping could be employed) and gate oxide 136. The upper region also has a patterned gate contact 140, a filled divot 146 and a nitride cap 148.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of fabricating a vertical gate transistor comprising:

forming a trench in a semiconductor substrate, the area of the trench being defined in at least one direction by a pad layer formed atop the semiconductor substrate;

forming a gate conductor in the trench;

forming a recess within the trench and partially filling the recess with a conformal conductive layer while leaving a first recess within the conformal conductive layer;

at least partially filling the first recess with a second conductive layer;

etching the conformal conductive layer to a level substantially coplanar with the pad layer;

removing the pad layer;

etching back the conformal conductive layer to a level below a top surface of the semiconductor substrate;

forming a liner layer atop the semiconductor substrate, the gate conductor, and the second conductive layer.

2. The method of claim 1 further comprising;

forming an array top oxide above the liner layer;

planarizing the array top oxide and the liner layer overlying the second conductive layer; and forming a gate contact to the second conductive layer.

3. The method of claim 2 wherein the step of planarizing the array top oxide is a chemical mechanical polish step.

4. The method of claim 1 wherein the step of at least partially filling the recess within the conformal conductive layer with a second conductive layer comprises:

forming a layer of the second conductive layer along the sidewalls and bottom of the first recess, thus forming a second recess within the second conductive layer; and filling the second recess with an insulator layer.

5. The method of claim 1 further comprising forming a gate oxide on a sidewall of the trench.

6. The method of claim 1 further comprising defining the trench in a second direction by forming an isolation trench on at least one boundary of the trench.

7. The method of claim 1 wherein the step of forming a recess within the trench comprises etching back the gate conductor to a level below a top surface of the semiconductor substrate.

8. A method of forming a vertical gate semiconductor device comprising:

forming a patterned layer on a top surface of a semiconductor wafer, the patterned layer having openings therein defining a trench region;

forming a trench in the trench region;

filling the trench with a gate conductor to a level substantially coplanar with the pad layer;

etching back the gate conductor to a level below the top surface of the semiconductor wafer;

applying a conformal layer of first gate stud material atop the pad layer and within the deep trench;

planarizing the conformal layer of first gate stud material to a level substantially coplanar with the pad layer;

forming a layer of second gate stud material in a recess formed within the conformal layer of first gate stud material, the second gate stud material protruding above the level of the pad layer;

etching back the conformal layer of first gate stud material with an etchant that does not substantially etch back the second gate stud material;

forming a first insulator layer over the remaining conformal layer of first gate stud material and the second gate stud material;

forming a second insulator layer over the first insulator layer; and removing the first and second insulator layer from a region on the second gate stud material to form a gate contact.

9. The method of claim 8 wherein said conformal first gate stud material comprises polysilicon or silicon germanium.

10. The method of claim 8 wherein said second gate stud material comprises germanium, silicon polysilicon, titanium, or titanium silicide.

11. The method of claim 8 wherein said etchant is selective to polysilicon.

12. The method of claim 8 further comprising forming a conductor line over said device and contacting the gate contact.

* * * * *